United States Patent
Budd et al.

[11] Patent Number: 6,147,730
[45] Date of Patent: Nov. 14, 2000

[54] COLOR FILTERS FORMED SEQUENTIALLY WITH INTERVENING PROTECTIVE FILMS FOR FLAT PANEL DISPLAYS

[75] Inventors: Russell Alan Budd, North Salem; George Liang-Tai Chiu, Cross River; Michael James Cordes, Newburgh; Steven Allen Cordes, Cortlandt Manor; James Patrick Doyle, Bronx, all of N.Y.

[73] Assignee: International Business Machines Corporation, Armonk, N.Y.

[21] Appl. No.: 09/201,191

[22] Filed: Nov. 30, 1998

[51] Int. Cl.[7] .................................................. G02F 1/1335
[52] U.S. Cl. ........................................... 349/106; 349/108
[58] Field of Search ..................... 349/106, 108; 430/7

[56] References Cited

U.S. PATENT DOCUMENTS

| | | | |
|---|---|---|---|
| 4,357,415 | 11/1982 | Hartman | 430/293 |
| 4,820,619 | 4/1989 | Sanada et al. | 430/197 |
| 5,340,619 | 8/1994 | Chen et al. | 424/498 |
| 5,705,302 | 1/1998 | Ohno et al. | 430/7 |
| 5,756,239 | 5/1998 | Wake | 430/7 |
| 5,888,679 | 5/1999 | Suzuki et al. | 430/7 |
| 5,891,597 | 4/1999 | Lee | 430/7 |
| 5,899,550 | 5/1999 | Masaki | 349/109 |
| 5,956,109 | 9/1999 | Jung | 349/110 |
| 5,976,734 | 11/1999 | Yamaguchi | 430/7 |

FOREIGN PATENT DOCUMENTS 6-235913  8/1994  Japan .

OTHER PUBLICATIONS

Tsuda, K "Color Filters for LCD's" Displays, Exelvier Science Publishers vol. 14 No. 2 Jan. 93 pp.115–124.

*Primary Examiner*—Kenneth Parker
*Assistant Examiner*—Mike Qi
*Attorney, Agent, or Firm*—Daniel P. Morris; Alvin J. Riddles

[57] ABSTRACT

Three component color sub-pixel element areas of red, green and blue, are serially formed in an overall pixel area, on a transparent substrate, and after each individual color sub pixel element formation, a layer of protective transparent material is applied over the individual sub pixel element and the pixel area before formation of the next sub pixel element. The protective layers render the sub pixel elements unaffected by the processing of subsequent sub pixel members where such conditions as high temperature curing, hardening agents or hardening processes are involved, whereby advantages are achieved in manufacturability, reliability, yield, cost, and throughput.

12 Claims, 2 Drawing Sheets

YO998-255

COLOR FILTERS FORMED SEQUENTIALLY WITH INTERVENING PROTECTIVE FILMS FOR FLAT PANEL DISPLAYS

FIELD OF THE INVENTION

The invention relates to flat panel color displays and in particular to the structure and process of formation of color filters having multiple component color sub pixels in each pixel of the display.

BACKGROUND OF THE INVENTION

Displays are devices that convert electronic signals into visible images for a viewer. The images may be for various purposes such as the display of text, graphic data, television, computer monitoring, vehicle instrumentation and other electronic to visual interfacing. The images are created by an array of dots called picture elements, or ' pixels'. Where the display is to have color, each pixel is made up of three separate color component sub-pixels. Each pixel is an addressable region at which a point of light passes through the sub-pixels and is tailored to a desired color and intensity so the pixel appears as a color dot selectable through the range of the visible spectrum and that the composite of all the pixels operates to assemble a desired colored display. As the art progresses there are combined desires to be able to have ever increasing pixel density which in turn means ever smaller area dimensions for pixel and sub pixel elements, together with being able to use an ever wider range of materials with different optical and processing properties.

A problem is being encountered in the art in that where elements must be processed individually and there are many types to be processed, it is becoming increasingly difficult to specify and execute a manufacturing process window for each subsequent type of element in the overall process without detrimentally overlapping one of the process windows of a previous element type. The problem is particularly acute where, in a situation such as the color filter of a display, each individual sub-pixel color element must be processed individually while the ingredients of the different color sub-pixel elements share the same or closely similar processing considerations.

DESCRIPTION OF THE INVENTION

In the fabrication of multi component color sub pixel elements that together occupy a single pixel in a display, an improvement is achieved by forming each sub pixel element separately, and then individually protecting the pixel area including that component color sub pixel element with a protective material layer that is not incompatible with any process specifications that will be involved in the overall assembly and further is not incompatible with the overall operation of the assembly before the fabrication of the next sub pixel element. In the fabrication of color filters in an example three component color sub-pixel element areas of red,green and blue, are serially formed in an overall pixel area, on a transparent substrate, and after each individual color sub pixel element formation, a layer of protective transparent material is applied over the individual sub pixel element and the pixel area before formation of the next sub pixel element.

DESCRIPTION OF THE INVENTION

Figure 1:
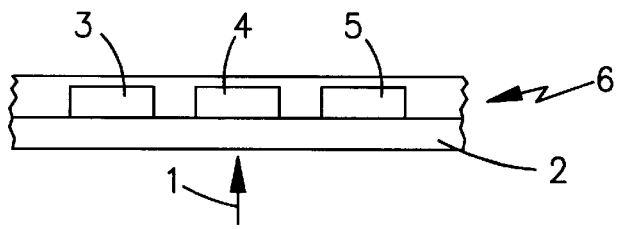
FIG. 1 is a perspective cross sectional illustration of a three sub-element pixel as used in the prior art.
Figure 2:
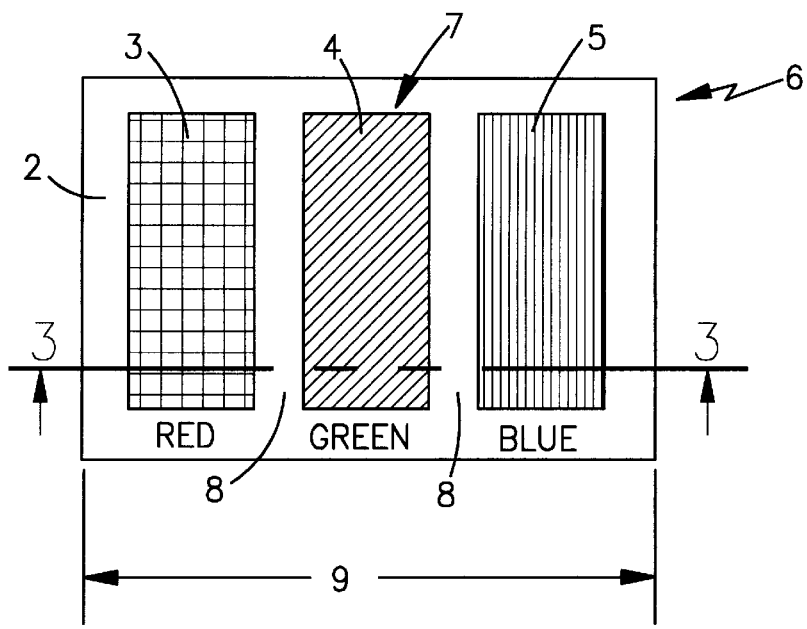
FIG. 2 is a top view of a prior art multi sub-element area of red, green and blue sub-pixel color elements.
Figure 3:
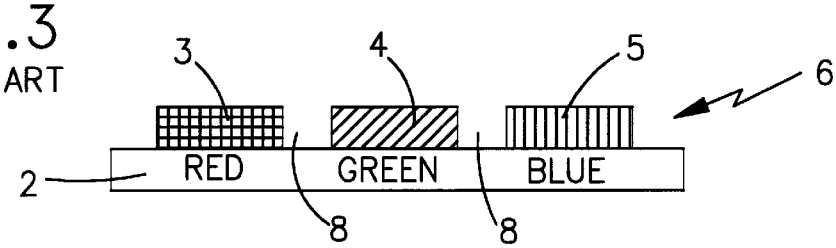
FIG. 3 is a cross sectional view along the line 3—3 of the prior art multi sub-element in FIG. 2.

Referring to FIGS. 1,2 and 3, which illustrate the present state of the art. FIG. 1 is a depiction of a side view of a single multiple component color filter pixel that would be assembled in a display. FIGS. 2 and 3 respectively are top and cross sectional views of the individual, component color sub pixel members, together in position on the substrate, as they would be for assembly in a display arrangement.

In FIG. 1 a source of light, depicted as an arrow 1, provides light through a transparent substrate 2 on which is positioned three separate, color areas 3,4 and 5, labelled in these prior art depictions as red, green and blue, for ease of coming explanation. The light source, symbolically shown as arrow 1, may vary for different types of displays. For Plasma type displays, the pixel will have a separate light location at each sub pixel element. Displays using Field Emission Devices are typically monochrome or single color. Field Emission Device type displays also have a separate light location at each pixel.

There is a type of display known in the art as the Thin Film Transistor (TFT) type where power is controlled at each pixel and a Projection type where a light valve action takes place at each pixel. The TFT and Projection displays have lower power consumption, greater portability, and lower cost and lend themselves to the radical increase in density display environment targeted for the next decade.

The Thin Film Transistor (TFT) and Projection type displays use a single light source for the entire display, with the individual component color sub-pixel elements serving as light valves, determining whether available light from the single common light source is utilized, and to what degree.

Where signals are required at each sub pixel, transparent electrode circuitry, of a material such as indium tin oxide (ITO), not shown, is provided in the display assembly.

The display types have in common the fact that the light, however it is generated, is passed through a filter member labelled 6 in FIGS. 1,2 and 3 to give color to the image. The color filter in turn is made up of red 3, green 4 and blue 5 thin films patterned in a manner such that at the display density, a red dot 3, a green dot 4 and a blue dot 5, all appear at each of the three sub pixel locations. The grouping forms a single pixel whose apparent color and brightness varies across a wide range of the visible spectrum.

There are variations in manufacturing techniques, but common to all is that each of the red, 3, the green, 4. and the blue, 5 sub pixel elements is to be fabricated in an area 7 as illustrated in FIG. 2, so that such an area must be assigned on the substrate 2 for the three sub pixel component color members, 3,4, and 5, with sufficient distance 8 between them and around them, for any area changes resulting from the processing and for any protective coverings. The processing of the sub pixel color elements is further complicated in part by the fact that each different color, whatever the chosen material, usually has the same or closely related solvent base, so that each color member may be subject to damage when exposed to subsequent processing of other sub pixel members. To prevent such damage, various means are employed in the art to render each sub pixel element somewhat impervious to the processing of subsequent members, such as high temperature curing, hardening agents or hardening processes. These each have problems in the areas of manufacturability, reliability, yield, reworkability, cost, and throughput. The present problems of the art are expected to be aggravated by the ongoing effort to produce ever smaller pixels critical to such new display applications as head mounted displays, hand held, and palmtop displays which are targeted to have dimensions as low as one tenth those of today.

Color filters are currently manufactured in the art by one of the following methods: Dyeing, Pigment-dispersion, Printing or Electrodeposition.

The dyeing method uses a photopolymer which is coated onto a glass substrate. The photopolymer is then exposed through a photomask, developed, and dyed by an acid or reaction dye. The dyed pattern is then treated with a hardening agent in order to make it impervious to processing of subsequent colors. The process is repeated a total of three times, one for each of the red, blue, and green colors.

The pigment-dispersed method is very similar to the dyed method in that it uses a photopolymer coated on a clear substrate. However, in the case of the pigment-dispersed method, the photopolymer already contains the color pigment, so dyeing is not necessary. The polymer is coated, exposed, and developed, then the polymer is hardened to prevent subsequent damage. The advantage of the pigment-dispersed method over the dyeing method is higher heat and chemical stability. The disadvantage of the pigment-dispersed is that the pigment causes the polymer to be more attenuating, thus requiring a higher exposure energy.

The printing method of color filter production involves four types of processes: screen printing, flexographic printing, offset printing, and intaglio printing. Screen printing is common within the electronics industry for a variety of processes, and involves squeezing the color material through a patterned gauze or screen. The Flexographic and offset printing methods involve direct transfer of a pattern from a roller to a substrate. The intaglio process involves etching of a desired pattern into the substrate, then squeezing the color material into the etched pattern. In each of the printing techniques, a hardening process is employed between any processing of different colors.

Printing processes in general are more cost efficient than both the dyeing and the pigment-dispersed types of methods; however, the resolution is approximately 50×more coarse.

In the electrodeposition method, a standard photoresist is coated on the clear substrate and patterned such that the photoresist is opened in the area of the required pixel. The color material is electrodeposited in the opened areas and the photoresist is then removed. The deposited color material is then hardened with a heat cycle, and the process repeated two more times for the remaining colors.

From the above discussion it will be apparent that progress in the fabrication of color flat panel displays is not only dependent on the fabrication of color light filtering elements but that those elements must be produced in iterative processing in ever decreasing sizes where subsequent processing operations can operate to the detriment of elements fabricated earlier in the iterative processing.

In accordance with the invention an improvement in color filter fabrication is achieved by forming, in an allotted pixel area, each sub pixel element separately in an individual operation, and then individually protecting the entire allotted pixel area including the fabricated sub pixel element, with a covering layer of a material that prevents subsequent processing damage before, the fabrication of each subsequent sub pixel element.

The invention is illustrated in connection with FIG. 4 which is a cross sectional depiction of the structural and processing changes involved in the invention, over the depiction of the prior art in FIG. 3, in forming a single pixel three component color sub pixel assembly of a display color filter.

Figure 4:
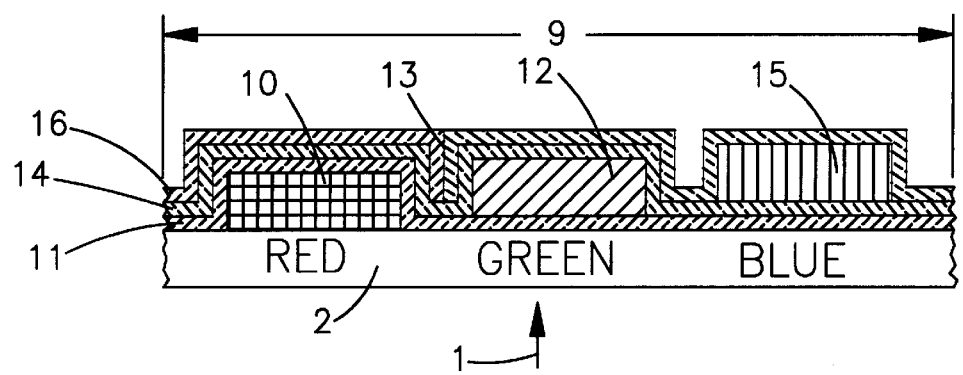
FIG. 4 is a cross sectional illustration of a three component color sub-pixel element structure of the invention.

Referring to FIG. 4, wherein like reference numerals for the previous figures are used where appropriate, on a transparent substrate 2, with light 1, an allotted area is assigned for a pixel, one dimension , the side, of which is shown in the cross section of FIG. 4 as element 9. In accordance with the invention a first sub pixel color element 10 is deposited on a selected sub area of the allotted pixel area within the dimension 9. A layer of a protective material 11 is placed over the entire allotted area including the element 10 and all exposed pixel portions of the substrate surface. The protective material must meet several functional requirements. It must be transparent and retain the transparency without becoming textured through all subsequent processing of the display, and it must not be detrimentally affected by any subsequent deposition and processing operations in the display fabrication. A variety of materials may be employed as a protective layer material, such as spin on glasses and various polymers. The spin on type process, standard in the art, is useful in that it does not require any extensive temperature excursion and the spinning operation results in a thin even layer. A preferred protective material that is compatible with spin on type processes is polymethylmethacrylate, (PMMA).

Continuing in connection with FIG. 4; the second sub pixel color element 12 is deposited at a selected sub area of the allotted pixel area within the dimension 9 on a portion of layer 11 in contact with the substrate 2. The spacing 13 between sub pixel areas, while for density purposes is kept as small as possible, must still be wide enough to accommodate all protective material layers as they cover and conform to the sub pixel component color members. A second layer of a protective material 14 is next placed over the entire allotted area including the elements 10 and 12 and all exposed portions of the protective layer 11 surface.

Further in connection with FIG. 4; the third sub pixel color element 15 is next deposited at a selected sub area of the allotted pixel area within the dimension 9 on the remaining exposed portion of the superimposed layers 11 and 14. A third layer of protective material 16 is next placed over the entire allotted area including the elements 10 and 12 and 15 and all exposed portions of the protective layer 14 surface. If a cover layer, not shown, were to be needed for such purposes as providing an even upper surface by filing the space between elements 12 and 15, such a cover layer could be provided over the layer 16.

In accordance with the invention in the structure of FIG. 4 there is an interrelated structural and processing modification over the techniques currently used in the art whereby the sub pixel elements are separately formed in position each in an individual operation, with each at each stage being protected with a covering that prevents subsequent processing damage. A principal benefit of the invention is acquired from the flexibility it provides in processing. The processing of the color filter provides a major portion of the cost and quality of the display assembly. The invention gives more flexibility in processes and materials that can be employed. The formation of the sub pixel elements in separate operations provides ability to rework partially completed displays.

The processing is depicted in connection with FIGS. 5a–5f in which in each figure there is shown a cross section of the partial product at each stage in the formation of the structure of FIG. 4 using the same reference numerals as in FIGS. 1–4 where appropriate.

Figure 5A:
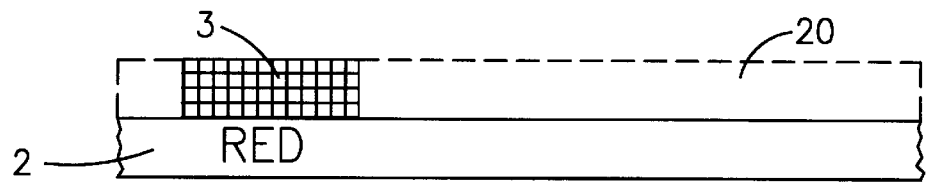
FIG. 5 is a flow chart of steps 5*a* to 5*f* illustrating a method of fabrication of the sub element assembly of the invention.

In the process of FIGS. 5a–5f a standard pigment-dispersed type method is employed as modified for this invention in which , in FIG. 5a, on a substrate 2 of clear glass there is provided a coat 20, of about 1 micrometer in thickness, shown dotted, of a standard in the art photoresist containing a dispersed red pigment which is baked to about 90 degrees C. The photoresist 20 is patterned, using standard lithographic techniques, to, after developing in a potassium hydroxide based developer, which removes the coat 20, thereby providing the first sub pixel color element 3.

Figure 5B:
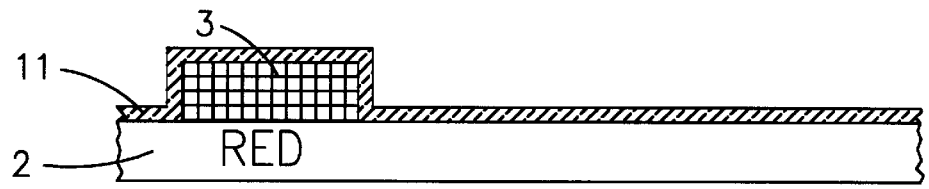

At this point, referring to FIG. 5b, a layer 11, of about 0.2 micrometers in thickness,of protective material is applied that will not deteriorate in all subsequent processing and which does not itself require processing conditions incompatible with the color sub pixel members. The material PMMA can be applied by the spinning technique standard in the art, is usually baked at temperatures about 120 degrees C, and conforms well to the shape of the sub pixel element 3.

Figure 5C:
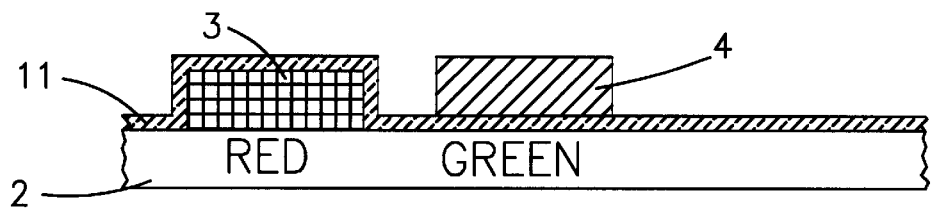

Referring to FIG. 5c a coat is applied over the layer 11 that is similar in material and thickness to coat 20 of FIG. 5a, but not shown ,of a standard in the art photoresist containing a dispersed green pigment which is baked to about 90 degrees C. The photoresist is patterned, using standard lithographic techniques, to, after developing in a potassium hydroxide based developer, which removes the coat, thereby providing the second sub pixel color element 4.

Figure 5D:
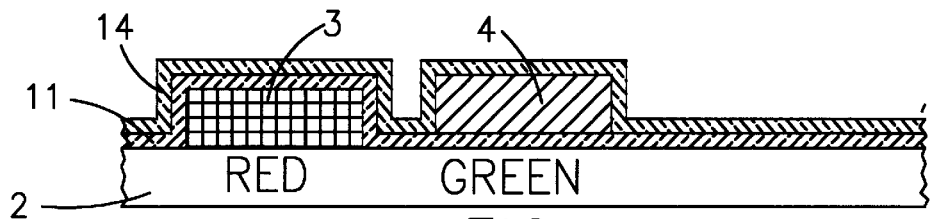

Referring to FIG. 5d, a second layer 14 of of about 0.2 micrometers in thickness of PMMA protective material is applied over the layer 11 which conforms well to the shape of the sub pixel elements 3 and 4.

Figure 5E:
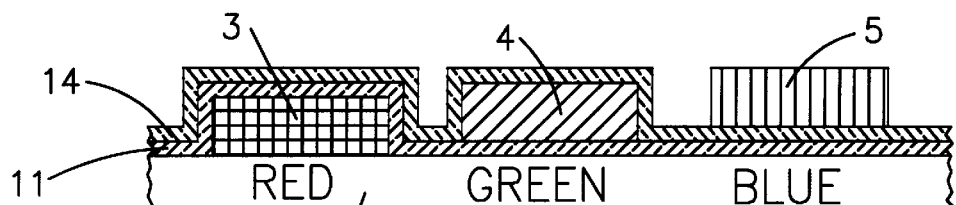

Referring to FIG. 5e a coat is applied over the layer 14 that is similar in material and thickness to coat 20 of FIG. 5a, but not shown , of a standard in the art photoresist containing a dispersed blue pigment which is baked to about 90 degrees C. The photoresist is patterned, using standard lithographic techniques, to, after developing in a potassium hydroxide based developer, which removes the coat, thereby providing the third sub pixel color element 5.

Figure 5F:
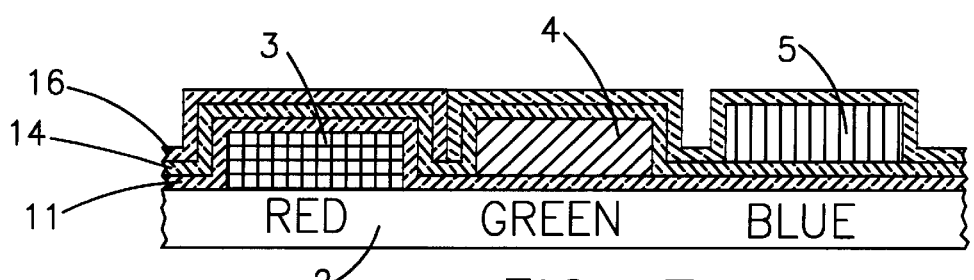

Referring to FIG. 5f, a third layer 16 of of about 0.2 micrometers in thickness of PMMA protective material is applied over the layer 14 which conforms well to the shape of the sub pixel elements 3 , 4 and 5.

The process of FIGS. 5a–5f provides a color filter pixel that is more reliable and less expensive than current prior art techniques. The fabrication of color sub pixel elements utilizing a barrier material provides the benefit of easy rework of previous colors when desired. As displays become more dense and complex, the ability to rework of portions becomes an increasingly attractive capability.

The process of FIGS. 5a–5f is directly adaptable to the other color filter fabrication techniques such as printing, electrodeposition and dyeing. Considering as an example the dyeing method, in which the coat 20 would be of photopolymer materials coated onto the glass substrate 2 and patterned using standard lithography techniques. The coating of polymer is then dyed to the selected sub pixel color by a standard in the art acid or a reaction dye. Then the dyed polymer sub pixel 3, 4, or 5 can be overcoated with a protective material layer such as PMMA as described in connection with the formation of layers 11,14 and 16. After the completion of the baking at 120 degrees C of the layers 11,14 and 16, the overall assembly can then stand temperatures in excess of 120 degrees C, should such temperatures be subsequently be encountered in later processing or service. What has been described is a structure and process for fabrication of a nmniple component color sub-pixel element areas where the sub pixel color areas are serially formed in an overall pixel area, on a transparent substrate, and after each individual component color element is formed a layer of protective transparent material is applied over each individual sub-pixel color element and the pixel area.

What is claimed is:

1. The process of manufacturing a color filter for a multiple component color pixel in an assigned pixel area in a flat panel display, comprising the steps of:

forming on a first portion of said assigned pixel area of a transparent substrate a first sub pixel color element, applying a first layer of protective material over said assigned pixel area including over said first sub pixel color element, forming on a second portion of said assigned pixel area of a transparent substrate a second sub pixel color element, applying a second layer of protective material over said assigned pixel area including over said second sub pixel color element, forming on a third portion of said assigned pixel area of a transparent substrate a third sub pixel color element, and, applying a third layer of protective material over said assigned pixel area including over said third sub pixel color element.

2. The process of claim 1 wherein said forming step for said first, second and third sub pixel color elements includes the step of spinning on a color pigment dispersed photopolymer.

3. The process of claim 2 wherein said color dispersed pigment is spun on to a depth of about 1.0 micrometer.

4. The process of claim 1 wherein said applying step for said first, second and third protective layers includes the step of spinning on polymethylmethacrylate.

5. The process of claim 4 wherein said polymethylmethacrylate is spun on to a depth of about 0.2 micrometers.

6. A color filter for a flat panel display in which there is a plurality of pixel locations made up of individual component color sub pixel elements positioned on a transparent substrate, comprising in combination:

a first component color sub pixel element in contact with a surface of said substrate positioned at a first location in an assigned pixel area of said substrate, a first protective layer of a material resistant to subsequent processing damage positioned in contact with said assigned area of said substrate surface, covering and conforming to said first component color sub pixel element, a second component color sub pixel element in contact with a surface of said first protective layer positioned at a second location in said assigned pixel area of said substrate, a second protective layer of a material resistant to subsequent processing damage positioned in contact with said first protective layer, covering and conforming to said second component color sub pixel element and said first sub pixel element covered by said first and second protective layers, a third component color sub pixel element in contact with a surface of said second protective layer positioned at a third location in said assigned pixel area, and, a third protective layer of a material resistant to subsequent processing damage positioned in contact with said second protective layer, covering and conforming to said third component color sub pixel element, and said first and second component color sub pixel elements covered by said first and second protective layers.

7. The color filter of claim 6 wherein each said sub pixel element is about 1.0 micrometer in thickness.

8. The color filter of claim 6 wherein each said protective layer is about 0.2 micrometers in thickness.

9. The color filter of claim 7 wherein each said protective layer is about 0.2 micrometers in thickness.

10. In the fabrication of color filters for flat panel displays, the improvement comprising:

in an assigned pixel area, the formation of each sub pixel color member in a separate operation, each said formation of each sub pixel component color member being followed by covering each formed sub pixel member and the entire said assigned pixel area with a protective covering layer of a material that is resistant to damage from further processing.

11. The improvement of claim 10 wherein the component colors of the sub pixel elements are red, green and blue.

12. The improvement of claim 10 wherein each said component color sub pixel member is about 1.0 micrometer in thickness and each said protective covering layer is about 0.2 micrometers in thickness.

* * * * *